(12) United States Patent
Edelstein et al.

(10) Patent No.: US 8,986,921 B2
(45) Date of Patent: Mar. 24, 2015

(54) LITHOGRAPHIC MATERIAL STACK INCLUDING A METAL-COMPOUND HARD MASK

(71) Applicant: International Business Machines Corporation, Armonk, NY (US)

(72) Inventors: Daniel C. Edelstein, White Plains, NY (US); Bryan G. Morris, Cohoes, NY (US); Tuan A. Vo, Albany, NY (US); Christopher J. Waskiewicz, Poughkeepsie, NY (US); Yunpeng Yin, Niskayuna, NY (US)

(73) Assignee: International Business Machines Corporation, Armonk, NY (US)

( * ) Notice: Subject to any disclaimer, the term of this patent is extended or adjusted under 35 U.S.C. 154(b) by 125 days.

(21) Appl. No.: 13/741,611

(22) Filed: Jan. 15, 2013

(65) Prior Publication Data
US 2014/0199628 A1    Jul. 17, 2014

(51) Int. Cl.
*G03F 7/00* (2006.01)
*H01L 21/00* (2006.01)
*H01L 21/311* (2006.01)
*H01L 21/302* (2006.01)
*G03F 7/09* (2006.01)

(52) U.S. Cl.
CPC ....................... *G03F 7/094* (2013.01)
USPC ........... 430/313; 430/311; 430/314; 430/317; 430/322; 430/325; 430/326; 430/331; 438/700; 438/722; 438/725; 438/724; 438/736; 438/770; 438/786

(58) Field of Classification Search
USPC ......... 430/311, 314, 313, 317, 322, 325, 326, 430/331, 700, 770, 786, 722, 724, 725, 736
See application file for complete search history.

(56) References Cited

U.S. PATENT DOCUMENTS

| | | | |
|---|---|---|---|
| 4,690,871 A | 9/1987 | Gordon | |
| 5,091,244 A | 2/1992 | Biornard | |
| 5,122,225 A | 6/1992 | Douglas | |
| 5,407,733 A | 4/1995 | Bjornard et al. | |
| 5,858,184 A | 1/1999 | Fu et al. | |
| 5,938,898 A | 8/1999 | Ando et al. | |
| 6,506,831 B2 * | 1/2003 | Hacker et al. | 524/509 |
| 6,517,951 B2 * | 2/2003 | Hacker et al. | 428/524 |
| 6,534,809 B2 | 3/2003 | Moise et al. | |
| 6,555,465 B2 * | 4/2003 | Yamaha | 438/624 |
| 6,589,839 B1 * | 7/2003 | Basceri et al. | 438/254 |

(Continued)

OTHER PUBLICATIONS

Tang, T.E. et al., "Titanium Nitride Local Interconnect Technology for VLSI" IEEE Transactions on Electron Devices (Mar. 1987) pp. 682-688, vol. ED-34, No. 3.

(Continued)

*Primary Examiner* — Amanda C. Walke
(74) *Attorney, Agent, or Firm* — Scully, Scott, Murphy & Presser, P.C.; Catherine Ivers

(57) ABSTRACT

A lithographic material stack including a metal-compound hard mask layer is provided. The lithographic material stack includes a lower organic planarizing layer (OPL), a dielectric hard mask layer, and the metal-compound hard mask layer, an upper OPL, an optional anti-reflective coating (ARC) layer, and a photoresist layer. The metal-compound hard mask layer does not attenuate optical signals from lithographic alignment marks in underlying material layers, and can facilitate alignment between different levels in semiconductor manufacturing.

18 Claims, 1 Drawing Sheet

(56) References Cited

U.S. PATENT DOCUMENTS

| | | | |
|---|---|---|---|
| 6,673,668 B2 * | 1/2004 | Kim et al. | 438/240 |
| 6,809,033 B1 * | 10/2004 | Hui et al. | 438/694 |
| 6,828,161 B2 | 12/2004 | Summerfelt et al. | |
| 7,045,070 B1 | 5/2006 | Weinrich et al. | |
| 7,112,532 B2 * | 9/2006 | Ali et al. | 438/700 |
| 7,166,538 B2 * | 1/2007 | Doshita | 438/723 |
| 7,981,777 B1 | 7/2011 | Subramonium et al. | |
| 8,119,531 B1 * | 2/2012 | Arnold et al. | 438/702 |
| 8,501,628 B2 * | 8/2013 | Luong et al. | 438/706 |
| 2004/0067634 A1 * | 4/2004 | Kim et al. | 438/622 |
| 2004/0203202 A1 * | 10/2004 | Shih | 438/241 |
| 2007/0037385 A1 * | 2/2007 | Huebinger et al. | 438/638 |
| 2007/0293007 A1 * | 12/2007 | Ito et al. | 438/258 |
| 2010/0044886 A1 * | 2/2010 | Sabouret et al. | 257/786 |
| 2010/0164846 A1 * | 7/2010 | Eom | 345/60 |
| 2010/0224916 A1 * | 9/2010 | Shimizu et al. | 257/288 |
| 2011/0065622 A1 * | 3/2011 | Lee et al. | 510/176 |
| 2011/0101507 A1 * | 5/2011 | Akinmade Yusuff et al. | 257/632 |
| 2011/0237084 A1 * | 9/2011 | Luong et al. | 438/720 |
| 2012/0009527 A1 * | 1/2012 | Hatakeyama et al. | 430/325 |
| 2013/0216776 A1 * | 8/2013 | Arnold et al. | 428/141 |
| 2013/0337650 A1 * | 12/2013 | Lee et al. | 438/702 |

OTHER PUBLICATIONS

Tomkins, H.G. et al., "Oxidation of TiN in an Oxygen Plasma Asher" Journal of Vacuum Science & Technology A: Vacuum, Surfaces, and Films (Jul./Aug. 1994) pp. 2446-2450, vol. 12, No. 4.

* cited by examiner

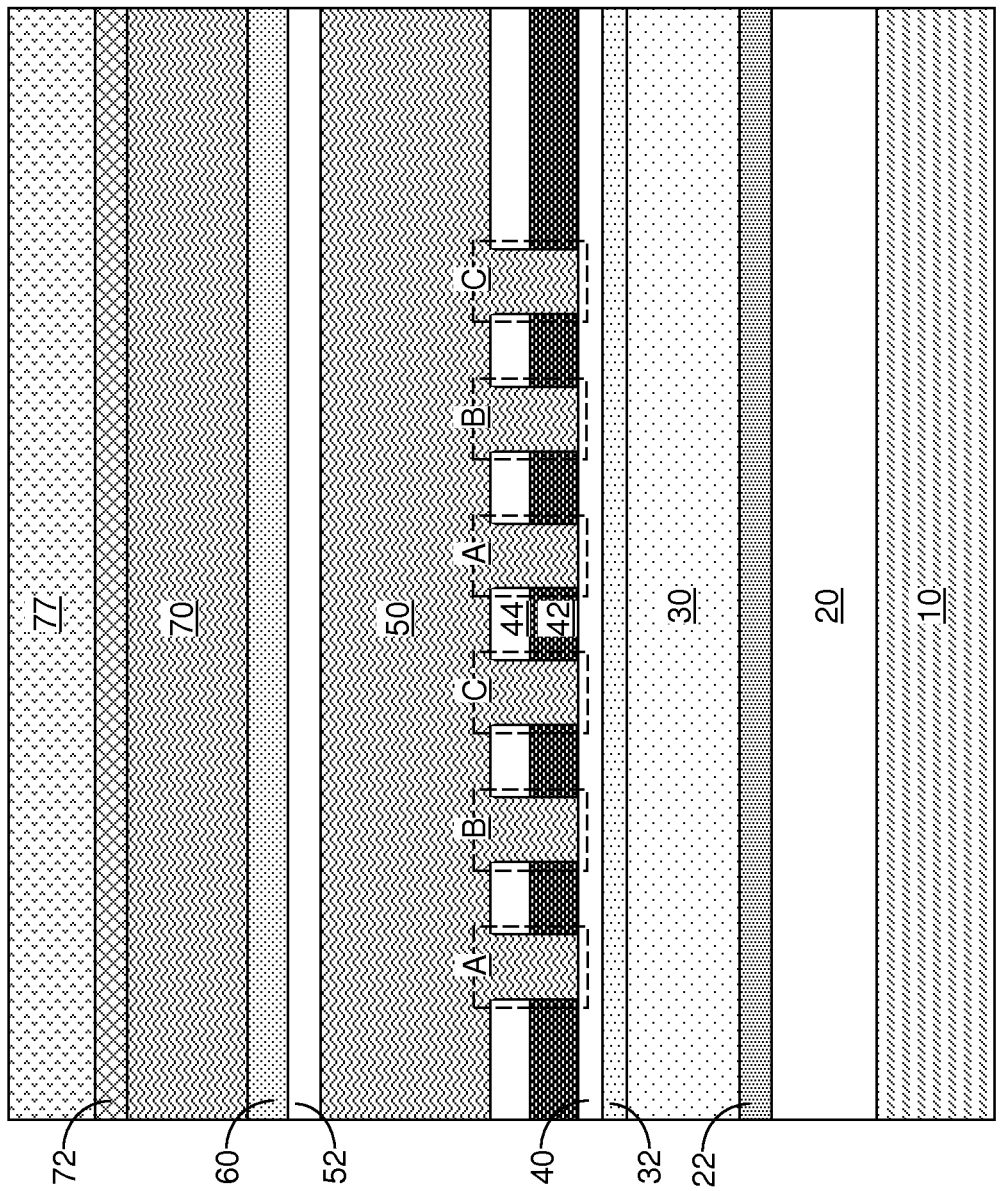

LITHOGRAPHIC MATERIAL STACK INCLUDING A METAL-COMPOUND HARD MASK

BACKGROUND

The present disclosure relates to semiconductor processing methods, and particularly to a lithographic material stack including a metal-compound hard mask layer and a method for forming the same.

Titanium nitride (TiN) is a material that provides high etch selectivity to organic materials such as photoresist materials and organic planarization materials, and dielectric materials such as SiN, SiO2 and low-k dielectric materials. Thus, organic materials and dielectric materials can be etched selective to TiN. However, TiN has a high extinction coefficient k value and is not an anti-reflective material. The value of the extinction coefficient k of TiN is in a range from 0.9 to 3.8 in the visible wavelength range. The high extinction coefficient of TiN poses a significant problem for the purpose of overlay alignment. In a lithographic stack in which a TiN layer is employed as a hard mask layer, if the TiN layer is too thick, an overly signal for the purpose of alignment from underlying lithographic alignment material layers is too weak, and lithographic alignment cannot be performed reliably. If the TiN layer in a lithographic stack is too thin, the fidelity of the image memorized into the TiN layer for the purpose of dual image transfer is degraded, and the shape of the pattern memorized in the TiN layer may be distorted.

BRIEF SUMMARY

A lithographic material stack including a metal-compound hard mask layer is provided. The lithographic material stack includes a lower organic planarizing layer (OPL), a dielectric hard mask layer, and the metal-compound hard mask layer, an upper OPL, an optional anti-reflective coating (ARC) layer, and a photoresist layer. The metal-compound hard mask layer does not attenuate optical signals from lithographic alignment marks in underlying material layers, and can facilitate alignment between different levels in semiconductor manufacturing.

According to an aspect of the present disclosure, a method of forming a material stack is provided. A patterned optically opaque layer including at least one alignment mark is formed on a substrate. A lower organic planarization layer (OPL) is formed over the patterned optically opaque layer. A dielectric hard mask layer is formed over the lower OPL. A metal-compound hard mask layer is formed over the dielectric hard mask layer. An upper OPL is formed over the metal-compound hard mask layer. A photoresist layer is formed over the OPL.

According to another aspect of the present disclosure, a material stack is provided. The lithographic material stack includes a patterned optically opaque layer including at least one alignment mark located on a substrate, a lower organic planarization layer (OPL) located over the patterned optically opaque layer, and a dielectric hard mask layer located over the lower OPL. A metal-compound hard mask layer is located over the dielectric hard mask layer. An upper OPL can be located over the metal-compound hard mask layer, and a photoresist layer can be located over the upper OPL.

BRIEF DESCRIPTION OF THE DRAWING

FIG. 1 is a vertical cross-sectional view of an exemplary lithographic material stack according to an embodiment of the present disclosure.

DETAILED DESCRIPTION

As stated above, the present disclosure relates to a lithographic material stack including a metal-compound hard mask layer and a method for forming the same, which are now described in detail with accompanying figures. The drawings are not necessarily drawn to scale.

Referring to FIG. 1, an exemplary material stack according to an embodiment of the present disclosure includes a substrate 10, one or more dielectric material layers formed on the substrate 10, a patterned optically opaque layer 42, an optional patterned optically transparent layer 44, and a lower organic planarization layer (OPL) 50, a dielectric hard mask layer 52, a metal-compound hard mask layer 60, an upper OPL 70, an antireflective coating (ARC) layer 72, and a photoresist layer 77.

The substrate 10 can be a semiconductor substrate, a dielectric substrate, a conductive substrate, or a combination thereof. If the substrate 10 is a semiconductor substrate, at least one semiconductor device (not shown) such as a field effect transistor, a bipolar transistor, a diode, a capacitor, or an inductor may be formed on the substrate 10. In one embodiment, the substrate 10 can be a bulk semiconductor substrate or a semiconductor-on-insulator (SOI) substrate.

The one or more dielectric material layers can include shallow trench isolation (STI) structures as known in the art, a gate-level dielectric material layer that embeds gate electrodes (not shown) of field effect transistors or emitters (not shown) of bipolar transistors, a contact-level dielectric material layer that embeds contact via structures (not shown), and/or metal interconnect level dielectric layers that embed metal via structures (not shown) and metal lines (not shown) as known in the art.

For example, the one or more dielectric material layers can include a first dielectric material layer 20, a first dielectric cap material layer 22, a second dielectric material layer 30, and a second dielectric cap material layer 32, and a dielectric etch stop layer 40. The dielectric materials of the first and second dielectric material layers (20, 30) can be, for example, porous or non-porous organosilicate glass, doped silicate glass (such as fluorine-doped silicate glass), undoped silicate glass, silicon nitride, silicon oxynitride, or combinations thereof. The thickness of the first or second dielectric material layers (20, 30) can be, for example, from 50 nm to 1,000 nm, although lesser and greater thicknesses can also be employed. The dielectric materials of the first and second dielectric cap material layers (22, 32) can be, for example, silicon oxide, silicon nitride, dielectric metal oxides, nitrogen-doped organosilicate glass, and combinations thereof. The thickness of the first or second dielectric cap material layers (22, 32) can be, for example, from 3 nm to 60 nm, although lesser and greater thicknesses can also be employed. The dielectric etch stop layer 40 includes a dielectric material that is different from the material of the patterned optically opaque layer 42. The dielectric material of the dielectric etch stop layer 40 is selected such that an etch that patterns the material of the patterned optically opaque layer 42 is selective to the dielectric material of the dielectric etch stop layer 40, i.e., does not etch the dielectric material of the dielectric etch stop layer 40. The dielectric material of the dielectric etch stop layer 40 can be, for example, silicon oxide or silicon nitride.

The patterned optically opaque layer 42 and optional patterned optically transparent layer 44 can be formed, for example, by forming a stack of a blanket (unpatterned) optically opaque layer and an optional blanket optically transparent layer, and by lithographically patterning the stack of the blanket optically opaque layer and the optional blanket optically transparent layer. As used herein, a material is "optically opaque" if the extinction coefficient k at the wavelength of 600 nm is not less than 1.0. As used herein, a material is "optically transparent" if the extinction coefficient k at the wavelength of 600 nm is less than 1.0. The lithographic patterning of the blanket optically opaque layer and the optional blanket optically transparent layer can be performed during patterning of other structures (not shown) that are formed at any of lithographic processes performed after formation of the blanket optically opaque layer and the optional blanket optically transparent layer.

In one embodiment, the blanket optically opaque layer can include a metal nitride. For example, the metal nitride can be titanium nitride (TiN), tantalum nitride (TaN), or tungsten nitride (WN). The blanket optically opaque layer can be deposited, for example, by physical vapor deposition (PVD). The thickness of the blanket optically opaque layer can be from 10 nm to 60 nm, although lesser and greater thicknesses can also be employed.

In one embodiment, the optional blanket optically transparent layer can include silicon oxide or silicon nitride. The optional blanket optically transparent layer can be deposited, for example, by chemical vapor deposition (CVD). The thickness of the optional blanket optically transparent layer can be from 10 nm to 60 nm, although lesser and greater thicknesses can also be employed.

In one embodiment, the patterns that are present in the optically opaque layer 42 and optically transparent layer 44 are formed through a pitch split triple patterning method, namely a litho-etch-litho-etch-litho-etch advanced patterning method. A first set of patterns A is memorized into the blanket optically transparent layer 44 and lands on blanket optically opaque layer 42 during a first series of processes. The first series of processes can include a first lithographic process and a first etch that transfers the pattern generated in the first lithographic process into blanket optically transparent layer 44 and lands on blanket optically opaque layer 42. The first set of lithographic patterns A may include shapes for patterning material layers and an alignment pattern. The stack of the patterned optically transparent layer 44 and blanket optically qpaque layer 42 with the first alignment structure A can be thus formed.

Additional sets of pattern structures may be formed within the stack of the patterned optically transparent layer 44 and lands on blanket optically opaque layer 42. For example, a second set of structure B can be formed through the stack of the patterned optically transparent layer 44 and lands on blanket optically opaque layer 42 during a second series of processes. The second series of processes can include a second lithographic process and a second etch that transfers the pattern generated in the second lithographic process into the stack of the patterned optically transparent layer 44 and land on blanket optically opaque layer 42. The second lithographic pattern includes shapes for patterning material layers and another alignment pattern. The same method may be repeatedly employed to form a third alignment structure C and/or any additional alignment structure corresponding to a series of processes that include a lithographic process and an etch process.

All the patterns and alignment marks that have been memorized into the optically transparent layer 44 will then be transferred into the optically opaque layer 42, by employing a common plasma dry etch using the optically transparent layer 44 as the etch mask.

Any lithographic process that is performed after formation of at least one set of patterned structures (A, B, and/or C) in the stack of the patterned optically opaque layer 42 and optional patterned optically transparent layer 44 can employ a lithographic material stack including the lower organic planarization layer (OPL) 50, the dielectric hard mask layer 52, the metal-compound hard mask layer 60, the upper OPL 70, the antireflective coating (ARC) layer 72, and the photoresist layer 77. The lithographic material stack (50, 52, 60, 70, 72, 77) can be formed after formation of the first set of structures A and prior to formation of any additional alignment structures, after formation of the first and second sets of structures (A, B) and prior to formation of any additional sets of structures, after formation of the first, second, third sets of structures (A, B, C) and prior to formation of any additional sets of structures, or after formation of the first, second, third sets of structures (A, B, C) and additional set of structures.

The lower OPL 50 includes an organic planarization material, which is a self-planarizing organic material that includes carbon, hydrogen, oxygen, and optionally nitrogen, fluorine, and silicon. In one embodiment, the self-planarizing organic material can be a polymer with sufficiently low viscosity so that the top surface of the applied polymer forms a planar horizontal surface. In one embodiment, the lower OPL 50 can include a transparent organic polymer. Non-limiting examples of organic planarizing material include, but are not limited to, CHM701B, commercially available from Cheil Chemical Co., Ltd., HM8006 and HM8014, commercially available from JSR Corporation, and ODL-102 or ODL-401, commercially available from ShinEtsu Chemical, Co., Ltd. The lower OPL 50 can be applied, for example, by spin-coating. The thickness of the lower OPL 50 can be from 100 nm to 400 nm, although lesser and greater thicknesses can also be employed.

The dielectric hard mask layer 52 includes a transparent dielectric material such as silicon oxide, silicon nitride, or silicon oxynitride. In one embodiment, the dielectric hard mask layer 52 can include silicon oxide material deposited by chemical vapor deposition. The thickness of the dielectric hard mask layer 52 can be from 10 nm to 100 nm, although lesser and greater thicknesses can also be employed.

The metal-compound hard mask layer 60 includes a metal compound, which can be conductive or dielectric. The metal-compound hard mask layer 60 is formed directly on the dielectric hard mask layer 52, and can have a thickness from 10 nm to 100 nm, although lesser and greater thicknesses can also be employed.

In one embodiment, the dielectric hardmask layer 52 and the metal compound hard mask layer 60 will be deposited at the temperatures that does not cause the underlying OPL layer 50 to degas or degrade.

In one embodiment, the metal-compound hard mask layer 60 includes a compound of titanium, oxygen, and at least another non-metallic element. In one embodiment, the metal-compound hard mask layer 60 can include titanium oxynitride. In this case, the metal-compound hard mask layer 60 can be formed by depositing a titanium nitride layer on the dielectric hard mask layer 52, and by converting the titanium nitride layer into the metal-compound hard mask layer 60 by an oxidation process.

In one embodiment, oxygen plasma treatment causes plasma oxidation of the titanium nitride material. The plasma treatment can employ a plasma of an oxygen-containing gas. As used herein, an "oxygen-containing gas" refers to a gas including at least one oxygen atom. Non-limiting examples of oxygen-containing gases include $O_2$, $N_2O$, $H_2O$ and $CO_2$. Alternately, electrochemical oxidation of titanium nitride may be employed to form the titanium oxynitride material.

In one embodiment, plasma oxidation of titanium nitride can be performed employing an oxygen plasma to convert the titanium nitride material into a titanium oxynitride material. A complete oxidation of titanium nitride has the reaction formula of:

$$TiN + O_2 \rightarrow TiO_2 + \tfrac{1}{2}N_2 (\Delta G = -611.8 \text{ kJ/mol at } 298 \text{ K}).$$

In the case of partial oxidation, the reaction formula is:

$$TiN + x/2 O_2 > TiO_xN_y + (1-y)/2 N_2.$$

The titanium oxynitride material in the metal-compound hard mask layer 60 has a composition of $TiO_xN_y$, in which x can be in a range from 0.1 to 1.9, and y can be in a range from 0.05 to 0.95, and (1−x)+2y can be in a range from 0.9 to 2.4. Small deviation from the formula can also acceptable since slight Ti-rich $TiO_xN_y$ will also work effectively for this application. Exemplary process parameters that can be employed to generate the oxygen plasma in a process chamber configured to process a 300 mm semiconductor substrate include a pressure in a range from 5 mTorr to 200 mTorr, radiofrequency (RF) power level in a range from 200 W to 2 kW at a frequency from 1 MHz to 100 MHz, $O_2$ gas flow in a range from 50 sccm to 2 slm, and a processing temperature in a range from 0 degree Celsius to 100 degree Celsius.

In another embodiment, plasma oxidation of titanium nitride can be performed employing a carbon dioxide plasma to convert the titanium nitride material into a titanium oxynitride material. The titanium oxynitride material in the metal-compound hard mask layer 60 has a composition of $TiO_xN_y$, in which x can be in a range from 0.1 to 1.9, and y can be in a range from 0.05 to 0.95, and (1−x)+2y can be in a range from 0.9 to 2.4. Exemplary process parameters that can be employed to generate the oxygen plasma in a process chamber configured to process a 300 mm semiconductor substrate include a pressure in a range from 5 mTorr to 200 mTorr, radiofrequency (RF) power level in a range from 200 W to 2 kW at a frequency from 1 MHz to 100 MHz, $CO_2$ gas flow in a range from 50 sccm to 2 slm, and a processing temperature in a range from 0 degree Celsius to 100 degree Celsius.

In yet another embodiment, electrochemical oxidation of titanium nitride can be employed to convert the titanium nitride material into a titanium oxynitride material. Titanium nitride can be converted into various materials by electrochemical oxidation. The various processes that can occur during electrochemical oxidation of titanium nitride include:

$$TiN + 2H_2O \rightarrow TiO_2 + \tfrac{1}{2}N_2 + 4H^+ + 4e^- \quad \text{(Reaction 1);}$$

$$TiN \rightarrow Ti^{3+} + \tfrac{1}{2}N_2 + 3e^- \quad \text{(Reaction 2);}$$

$$TiN + 3H_2O \rightarrow Ti(OH)_3 + \tfrac{1}{2}N_2 + 3H^+ + 3e^- \quad \text{(Reaction 3); and}$$

$$TiN + 3H_2O \rightarrow TiO_2 \cdot H_2O + \tfrac{1}{2}N_2 + 4H^+ + 4e^- \quad \text{(Reaction 4).}$$

Partial oxidation of the titanium nitride material through electrochemical oxidation in combination with dehydration can be employed to provide the titanium oxynitride material of the titanium oxynitride layer 36. The titanium oxynitride material in the metal-compound hard mask layer 60 has a composition of $TiO_xN_y$, in which x can be in a range from 0.1 to 1.9, and y can be in a range from 0.05 to 0.95, and (1−x)+2y can be in a range from 0.9 to 2.4. Small deviation from the formula can also acceptable since slight Ti-rich $TiO_xN_y$ will also work effectively for this application.

The titanium nitride layer as formed includes a titanium nitride material, which is an optically opaque material having an extinction coefficient of about 2.3 at the wavelength of 600 nm. Introduction of oxygen into the titanium nitride material reduces the extinction coefficient, and converts the titanium nitride material into a titanium oxynitride material. The decrease in the extinction coefficient of the titanium oxynitride material thus formed depends on the amount of oxygen introduced into the titanium oxynitride material. The extinction coefficient in the titanium oxynitride material of the metal-compound hard mask layer 60 at the wavelength of 600 nm can be in a range from 0.01 to 1.5. In one embodiment, the extinction coefficient in the titanium oxynitride material of the metal-compound hard mask layer 60 at the wavelength of 600 nm can be in a range from 0.01 to 0.99. In another embodiment, the extinction coefficient in the titanium oxynitride material of the metal-compound hard mask layer 60 at the wavelength of 600 nm can be in a range from 0.01 to 0.50. In yet another embodiment, the extinction coefficient in the titanium oxynitride material of the metal-compound hard mask layer 60 at the wavelength of 600 nm can be in a range from 0.10 to 0.50. In one embodiment, the metal-compound hard mask layer 60 can be optically transparent.

In one embodiment, the metal-compound hard mask layer 60 can be optically transparent, i.e., can have an extinction coefficient k that is less than 1.0 at the wavelength of 600 nm. In general, the less the extinction coefficient k, the easier for light to pass through the metal-compound hard mask layer 60 for the purpose of overlay alignment during lithographic processes to the underlying alignment marks such as the first, second, and third sets of patterned structures (A, B, C).

In another embodiment, the metal-compound hard mask layer 60 can include a compound of titanium, silicon, and oxygen. For example, the metal-compound hard mask layer 60 can include $Ti_xSi_{1-x}O_2$, in which x is greater than 0 and is less than 1.0. In this case, the metal-compound hard mask layer 60 can be formed by first forming a titanium oxide layer and by implanting silicon into the titanium oxide layer. The titanium oxide layer can be formed, for example, by reactive sputtering of titanium in an oxygen-containing ambient, or by deposition of titanium by physical vapor deposition and subsequent oxidation of titanium into titanium oxide by thermal oxidation or by plasma oxidation. Silicon can be implanted into the titanium oxide layer. Alternately, a silicon titanium alloy can be provided by implanting titanium into silicon or by implanting titanium into silicon. After an alloy including titanium and silicon is provided, the metal-compound hard mask layer 60 can be formed oxidizing the alloy of titanium and silicon by plasma oxidation or thermal oxidation. Yet alternately, the silicon titanium alloy can be formed by spin coating of particles of a compound including titanium, silicon, and oxygen. Particles of compounds including titanium, silicon, and oxygen are commercially available as an antireflective coating material.

In yet another embodiment, the metal-compound hard mask layer 60 can include a metal oxide having a dielectric constant greater than 8.0. For example, the metal-compound hard mask layer includes aluminum oxide. Aluminum oxide can be deposited, for example, by atomic layer deposition (ALD).

The metal-compound hard mask layer 60 of the present disclosure provides enhanced transparency over conventional opaque hard mask material including titanium nitride. Thus, the pattern of the underlying alignment structures (e.g., the first alignment structure A, the second alignment structure B, and/or the third alignment structure C) can be more easily identified in a metrology tool that measures overly of a pattern with respect to preexisting patterns.

The upper OPL 70 is formed over the metal-compound hard mask layer 60, for example, by spin coating. The upper OPL 70 includes an organic planarization material, which can be any of the organic planarization materials that can be employed for the lower OPL 50. The thickness of the upper OPL 70 can be from 100 nm to 400 nm, although lesser and greater thicknesses can also be employed.

The ARC layer 72 is an optional layer, and can be formed, for example, by spin coating. The ARC layer 72 can include any anti-reflective material known in the art, and can include silicon and/or an organic material. The thickness of the ARC layer 72 can be from 10 nm to 150 nm, although lesser and greater thicknesses can also be employed.

The photoresist layer 74 is applied directly on the ARC layer 72 or directly on the upper OPL 70, for example, by spin coating. The thickness of the photoresist layer 74 can be from 100 nm to 600 nm, although lesser and greater thicknesses can also be employed. The photoresist layer 74 can be a layer of a photoresist sensitive to deep-ultraviolet (DUV) radiation, extreme ultraviolet (EUV), or mid-ultraviolet (MUV) radiation as known in the art, or can be an e-beam resist that is sensitive to radiation of energetic electrons.

The lithographic material stack (50, 52, 60, 70, 72, 77) can provide a greater transparency than conventional trilayer lithographic material stacks that employ a titanium nitride layer, which has the extinction coefficient k of about 2.0 at the wavelength of 600 nm. The extinction coefficient of the titanium oxynitride material, the titanium silicon oxide material, and the aluminum oxide material of the present disclosure provide an extinction coefficient k less than 2.0 at the wavelength of 600 nm, and can provide an extinction coefficient less than 1.0 at the wavelength of 600 nm. Further, the metal-compound hard mask layer 60 of the present disclosure can provide substantially the same etch selectivity, i.e., etch resistance, to the etch chemistry employed to remove organic planarization materials of the upper OPL 70 and the lower OPL 50. Thus, the lithographic material stack (50, 52, 60, 70, 72, 77) of the present disclosure can provide superior overlay performance in lithographic processes compared to conventional lithographic material stacks.

While the disclosure has been described in terms of specific embodiments, it is evident in view of the foregoing description that numerous alternatives, modifications and variations will be apparent to those skilled in the art. Each of the various embodiments of the present disclosure can be implemented alone, or in combination with any other embodiments of the present disclosure unless expressly disclosed otherwise or otherwise impossible as would be known to one of ordinary skill in the art. Accordingly, the disclosure is intended to encompass all such alternatives, modifications and variations which fall within the scope and spirit of the disclosure and the following claims.

What is claimed is:

1. A method of forming a material stack, said method comprising:
    forming a patterned optically opaque layer including at least one alignment mark on a substrate;
    forming a lower organic planarization layer (OPL) over said patterned optically opaque layer;
    forming a dielectric hard mask layer over said lower OPL;
    forming a titanium nitride layer over said dielectric hard mask layer;
    converting said titanium nitride layer into a metal-compound hard mask layer comprising titanium oxynitride by plasma oxidation employing a carbon dioxide plasma or by electrochemical oxidation;
    forming an upper OPL over said metal-compound hard mask layer; and
    forming a photoresist layer over said OPL.

2. The method of claim 1, wherein said titanium oxynitride has a composition of $TiO_xN_y$, wherein x is in a range from 0.1 to 1.9, and y is in a range from 0.05 to 0.95, and $(1-x)+2y$ is in a range from 0.9 to 2.4.

3. The method of claim 1, wherein said dielectric hard mask layer comprises a material selected from silicon oxide, silicon nitride, silicon oxynitride, and a nitrogen-containing organosilicate glass.

4. The method of claim 1, further comprising forming one or more dielectric material layers on said substrate prior to said forming said patterned optically opaque layer.

5. The method of claim 4, wherein said forming said one or more dielectric material layers comprises:
    forming a first dielectric material layer on said substrate;
    forming a first dielectric cap material layer on said first dielectric material layer;
    forming a second dielectric material layer on said first dielectric cap material layer;
    forming a second dielectric cap material layer on said second dielectric material layer; and
    forming a dielectric etch stop layer on said second dielectric cap material layer.

6. The method of claim 5, wherein each of said first dielectric material layer and said second dielectric material layer comprises a porous or a non-porous organosilicate glass, a doped silicate glass, an undoped silicate glass, silicon nitride, silicon oxynitride, or a combination thereof.

7. The method of claim 5, wherein each of said first dielectric cap material layer and said second dielectric cap material layer comprises silicon oxide, silicon nitride, a dielectric metal oxide, a nitrogen-doped organosilicate glass, or a combination thereof.

8. The method of claim 5, wherein the dielectric etch stop layer comprises silicon oxide or silicon nitride.

9. The method of claim 5, further comprising forming a blanket optically opaque layer on said one or more dielectric material layers.

10. The method of claim 9, wherein said blanket optically opaque layer comprises titanium nitride, tantalum nitride, or tungsten nitride.

11. The method of claim 9, further comprising forming a blanket optically transparent layer on said blanket optically opaque layer.

12. The method of claim 11, wherein said blanket optically transparent layer comprises silicon oxide or silicon nitride.

13. The method of claim 11, wherein said forming said patterned optically opaque layer comprises forming at least one pattern structure in a stack of said blanket optically transparent layer and said blanket optically opaque layer.

14. The method of claim 1, further comprising forming an antireflective coating (ARC) layer on said upper OPL prior to said forming said photoresist layer.

15. The method of claim 1, each of said lower OPL and said upper OPL comprises a self-planarizing organic material that includes carbon, hydrogen, oxygen, and optionally nitrogen, fluorine, and silicon.

16. A lithographic material stack comprising:
    a patterned optically opaque layer including at least one alignment mark located on a substrate;
    a lower organic planarization layer (OPL) located over said patterned optically opaque layer;
    a dielectric hard mask layer located over said lower OPL;
    a metal-compound hard mask layer located over said dielectric hard mask layer, said metal-compound hard mask layer comprising titanium oxynitride having an extinction coefficient less than 1.0 at a wavelength of 600 nm;

an upper OPL located over said metal-compound hard mask layer; and a photoresist layer located over said upper OPL.

17. The lithographic material stack of claim 16, wherein said titanium oxynitride has a composition of $TiO_xN_y$, wherein x is in a range from 0.1 to 1.9, and y is in a range from 0.05 to 0.95, and (1−x)+2y is in a range from 0.9 to 2.4.

18. The lithographic material stack of claim 16, wherein said dielectric hard mask layer comprises a material selected from silicon oxide, silicon nitride, silicon oxynitride, and a nitrogen-containing organosilicate glass.

* * * * *